United States Patent
Takeuchi et al.

(10) Patent No.: US 10,593,831 B2
(45) Date of Patent: Mar. 17, 2020

(54) NITRIDE SEMICONDUCTOR MULTILAYER FILM REFLECTOR AND LIGHT-EMITTING DEVICE USING THE SAME

(71) Applicant: MEIJO UNIVERSITY, Nagoya-shi, Aichi (JP)

(72) Inventors: Tetsuya Takeuchi, Nagoya (JP); Motoaki Iwaya, Nagoya (JP); Isamu Akasaki, Nagoya (JP)

(73) Assignee: MEIJO UNIVERSITY, Nagoya-Shi, Aichi (JP)

( * ) Notice: Subject to any disclaimer, the term of this patent is extended or adjusted under 35 U.S.C. 154(b) by 405 days.

(21) Appl. No.: 14/781,475

(22) PCT Filed: Mar. 19, 2014

(86) PCT No.: PCT/JP2014/057523
§ 371 (c)(1),
(2) Date: Sep. 30, 2015

(87) PCT Pub. No.: WO2014/167965
PCT Pub. Date: Oct. 16, 2014

(65) Prior Publication Data
US 2016/0056333 A1 Feb. 25, 2016

(30) Foreign Application Priority Data

Apr. 8, 2013 (JP) .................................. 2013-080234

(51) Int. Cl.
*H01L 33/10* (2010.01)
*H01S 5/183* (2006.01)
(Continued)

(52) U.S. Cl.
CPC .......... *H01L 33/10* (2013.01); *H01L 33/0075* (2013.01); *H01L 33/06* (2013.01);
(Continued)

(58) Field of Classification Search
CPC ......... H01L 33/32; H01L 33/06; H01L 33/04; H01L 33/14; H01L 21/0254;
(Continued)

(56) References Cited

U.S. PATENT DOCUMENTS 6,734,111 B2  5/2004  Lindström et al.
6,803,605 B2  10/2004  Lindstrom et al.
(Continued)

FOREIGN PATENT DOCUMENTS

CN    11541419 A   10/2004
CN     1897318 A    1/2007
(Continued)

OTHER PUBLICATIONS

Office Action dated May 4, 2017 for Chinese Patent Application No. 201480020256.7 (10 pages in Chinese with English translation).
(Continued)

*Primary Examiner* — David Chen
(74) *Attorney, Agent, or Firm* — Smith, Gambrell & Russell, LLP

(57) ABSTRACT

Achieving resistance reduction of a nitride semiconductor multilayer film reflector. In the nitride semiconductor multilayer film reflector, a first semiconductor layer has a higher Al composition than a second semiconductor layer. A first composition-graded layer is interposed between the first and second semiconductor layers so as to be located at a group III element face side of the first semiconductor layer, the first composition-graded layer being adjusted so that its Al composition becomes lower as coming close to the second semiconductor layer. A second composition-graded layer is interposed between the first and second semiconductor layers so as to be located at a nitride face side of the first semiconductor layer. The second composition-graded layer
(Continued)

is adjusted so that its Al composition becomes lower as coming close to the second semiconductor layer.

10 Claims, 10 Drawing Sheets

(51) Int. Cl.
*H01L 33/06* (2010.01)
*H01L 33/14* (2010.01)
*H01L 33/00* (2010.01)
*H01S 5/343* (2006.01)
*H01L 33/32* (2010.01)

(52) U.S. Cl.
CPC .......... *H01L 33/14* (2013.01); *H01S 5/18361* (2013.01); *H01L 33/32* (2013.01); *H01S 5/34333* (2013.01)

(58) Field of Classification Search
CPC ........... H01L 21/02458; H01L 29/2003; H01L 33/0075; H01L 33/007; H01L 21/02507; H01L 21/0251; H01S 5/34333; H01S 5/305
USPC .................. 257/13, 76, 94, 97, 103, E33.008
See application file for complete search history.

(56) References Cited

U.S. PATENT DOCUMENTS

| 7,384,808 | B2 | 9/2008 | Liu et al. |
| 2002/0195619 | A1 | 12/2002 | Makimoto et al. |
| 2004/0091011 | A1 | 5/2004 | Liu et al. |
| 2008/0043796 | A1 | 2/2008 | Jikutani et al. |
| 2008/0308787 | A1 | 12/2008 | Lee et al. |
| 2009/0072254 | A1* | 3/2009 | Chakraborty ........... H01L 33/14 257/97 |
| 2009/0224226 | A1* | 9/2009 | Huang .................... H01L 33/06 257/13 |
| 2010/0059734 | A1 | 3/2010 | Kaneko et al. |
| 2011/0026555 | A1 | 2/2011 | Takeuchi |
| 2012/0001151 | A1 | 1/2012 | Kaneko et al. |
| 2013/0112988 | A1 | 5/2013 | Kaneko et al. |

FOREIGN PATENT DOCUMENTS

| JP | H06-196804 A | 7/1994 |
| JP | 2000-332364 A | 11/2000 |
| JP | 2001-057464 A | 2/2001 |
| JP | 2003-059938 A | 2/2003 |
| JP | 2003-273469 A | 9/2003 |
| JP | 2004-031925 A | 1/2004 |
| JP | 2007-059756 A | 3/2007 |
| JP | 2008-311658 A | 12/2008 |
| JP | 2010-067709 A | 3/2010 |
| JP | 2011-035115 A | 2/2011 |
| JP | 2011-35324 A | 2/2011 |

OTHER PUBLICATIONS

Office Action dated Apr. 20, 2017 for Taiwan Patent Application No. 103112673 (3 pages in Chinese with standard letter relevance classification).

International Search Report for PCT/JP2014/057523, dated Jun. 3, 2014 in English & Japanese.

* cited by examiner

NITRIDE SEMICONDUCTOR MULTILAYER FILM REFLECTOR AND LIGHT-EMITTING DEVICE USING THE SAME

TECHNICAL FIELD

The present invention relates to a nitride semiconductor multilayer film reflector and a light-emitting device using the same.

BACKGROUND ART

An AlGaAs surface-emitting semiconductor laser device extracting laser light from a direction perpendicular to a substrate surface has semiconductor multilayer film reflectors in a vertical direction of an active layer, in order to make up an optical resonator. The semiconductor multilayer film reflector is configured of first and second semiconductor layers which are stacked alternately and have respective bandgap energies larger than energy corresponding to an oscillation wavelength of laser light.

In the semiconductor multilayer film reflector, the first and second semiconductor layers having a large refractive index difference, namely, a large bandgap energy difference therebetween are selected in order to realize a high reflectance. This results in a higher heterojunction barrier produced on a junction of the layers. Consequently, there arises a problem that this prevents electrons or hole current from flowing, with the result that the semiconductor multilayer film reflector has a high resistance value. Undermentioned Patent Document 1 discloses a technique to realize resistance reduction of the semiconductor multilayer film reflector by interposing a non-doped third semiconductor layer between the first and second semiconductor layers thereby to lower a hetero barrier of the heterojunction of the first and third semiconductor layers. The third semiconductor layer has the same composition as the second semiconductor layer and a smaller layer thickness than the second semiconductor layer. As a result, the tunneling of electrons or hole is enhanced.

PRIOR ART DOCUMENT

Patent Documents

Patent Document 1: Japanese Patent Application Publication No. JP-A-H06-196804

SUMMARY OF THE INVENTION

Problem to be Overcome by the Invention

However, when the semiconductor multilayer film reflector is configured of a nitride semiconductor, the resistivity is hard to lower since the nitride semiconductor is a wide-gap semiconductor material itself. Further, there is also a problem that the hetero barrier produced on the heterojunction interface between the semiconductor layers is rendered higher.

Further, the inventors actively examined a factor denoting that the nitride semiconductor multilayer film reflector has a high resistance. As a result, the inventors found that an extremely large polarization was formed on the junction interface between the first and second semiconductor layers having different reflectances by a polarization effect peculiar to the nitride semiconductor material. The inventors found that an energy barrier resulting from the polarization effect was a main factor denoting that the semiconductor multilayer film reflector has a high resistance.

The invention was made in view of the new factor found by the inventors as well as the foregoing conventional circumstances and an object thereof is to realize a low-resistance nitride semiconductor multilayer film reflector which is capable of reducing the energy barrier produced on the nitride semiconductor heterojunction interface by polarization effect and is current-injectable.

Means for Overcoming the Problem

A nitride semiconductor multilayer film reflector according to the first invention includes a first semiconductor layer comprised of a group III nitride semiconductor, a second semiconductor layer, a first composition-graded layer and a second composition-graded layer. The nitride semiconductor multilayer film reflector is fabricated by alternately stacking a plurality of pairs of the first and second semiconductor layers. The first semiconductor layer has a higher Al composition than the second semiconductor layer. The first composition-graded layer is interposed between the first and second semiconductor layers so as to be located at a group III element face side of the first semiconductor layer. The first composition-graded layer is adjusted so that the Al composition thereof becomes lower as the first composition-graded layer comes close to the second semiconductor layer. The second composition-graded layer is interposed between the first and second semiconductor layers so as to be located at a nitride face side of the first semiconductor layer. The second composition-graded layer is adjusted so that the Al composition thereof becomes lower as the second composition-graded layer comes close to the second semiconductor layer. Energy levels of electrons at bottoms of conduction bands of the first and second semiconductor layers and the first and second composition-graded layers are continuous without band offset. The first composition-graded layer has an n-type impurity concentration of not less than $5 \times 10^{19}$ $cm^{-3}$.

The nitride semiconductor multilayer film reflector includes the first or second composition-graded layer which is located between the first semiconductor layer and the second semiconductor layer having the lower Al composition than the first semiconductor layer and which is adjusted so that the Al composition becomes lower as the first or second composition-graded layer comes close to the second semiconductor layer from the first semiconductor layer. As a result, energy levels of electrons at bottoms of conduction bands of the respective layers are continuous almost without band offset, so that the energy barrier against electrons as carriers is reduced. Further, since an energy barrier produced by polarization effect between the first and second semiconductor layers can be reduced to a large degree by doping the first composition-graded layer with the n-type impurity having the concentration of not less than $5 \times 10^{19}$ $cm^{-3}$, resistance reduction of the nitride semiconductor multilayer film reflector is realized with the result that current injection becomes possible.

A light-emitting device is characterized by having the nitride semiconductor multilayer film reflector of the first invention.

Since the light-emitting device includes the nitride semiconductor multilayer film reflector of the first invention, the length of the resonator can be reduced, so that an internal loss and threshold current can be reduced to a large degree.

MODE FOR CARRYING OUT THE INVENTION

Preferred embodiments of the invention will be described.

In the nitride semiconductor multilayer film reflector of the first invention, the first and second composition-graded layers may have respective film thicknesses of not more than 20 nm. In this case, a reflectance of the multilayer film reflector can be prevented from reduction.

In the nitride semiconductor multilayer film reflector of the first invention, the first and second semiconductor layers may be an AlGaN layer and a GaN layer respectively and the AlGaN layer may have an Al composition value ranging from 0.4 to 0.6. The first and second composition-graded layers may be AlGaN layers having Al compositions graded from 0 to the Al composition values respectively. In this case, the multilayer film having a relatively higher quality and higher reflectance can be deposited at a high speed by forming the first and second semiconductor layers and the first and second composition-graded layers into the AlGaN layers or the GaN layers. Since the multilayer film reflector is fabricated by 40 to 60 pairs of the first and second semiconductor layers, the manufacturing processes and manufacturing costs can be reduced to a large degree by the realization of high-speed deposition.

In the nitride semiconductor multilayer film reflector of the first invention, the first and second semiconductor layers may be an AlInN layer and a GaN layer respectively and the AlInN layer may have an Al composition value ranging from 0.82 to 0.85, and the first and second composition-graded layers may be AlInN layers having Al compositions graded from 0.6 to the Al composition values respectively. In this case, the first and second semiconductor layers are substantially lattice-matched with each other when AlInN and GaN are used as the first and second semiconductor layers respectively and the Al composition value of the AlInN layer is ranged from 0.82 to 0.85. As a result, crystal defects such as dislocation is less likely to occur during deposition, so that high quality semiconductor layers can be obtained.

Embodiments 1 to 3 embodying the nitride semiconductor multilayer film reflector of the first invention and the light-emitting device of the second invention will be described with reference to the drawings.

Embodiment 1

Figure 1:
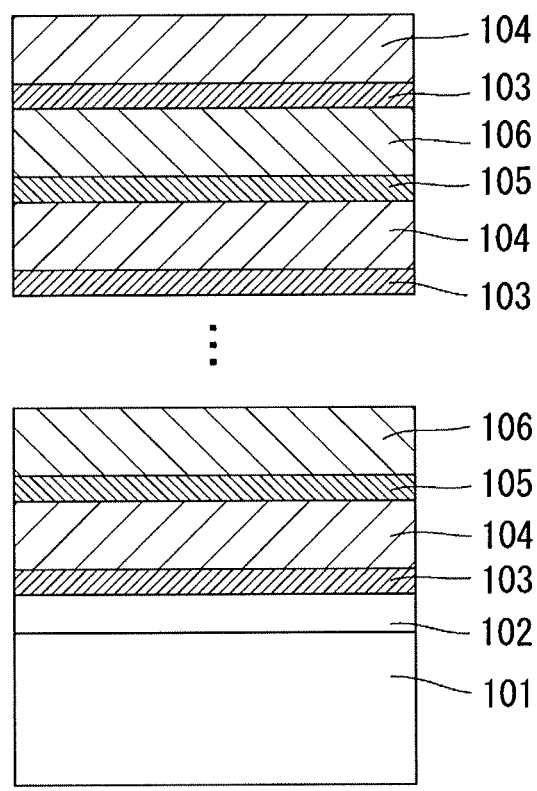
FIG. 1 is a cross-sectional view of the nitride semiconductor multilayer film reflector of embodiment 1.

As shown in FIG. 1, a nitride semiconductor multilayer film reflector is fabricated. In the reflector, a second composition-graded AlGaN layer (a second composition-graded layer) 103/an $Al_{0.5}Ga_{0.5}N$ layer (a first semiconductor layer) 104 and a first composition-graded AlGaN layer (a first composition-graded layer) 105/a GaN layer (a second semiconductor layer) 106 are paired and are stacked sequentially in this order into a layered structure. The $Al_{0.5}Ga_{0.5}N$ is selected as the first semiconductor layer 104. The GaN is selected as the second semiconductor layer 106. When the first semiconductor layer 104 has an excessively high Al composition value, a lattice mismatch with the GaN as the second semiconductor layer 106 becomes excessively large, so that the crystallinity deteriorates and a reflectance is reduced with this. Contrarily, when the first semiconductor layer 104 has an excessively low Al composition value, a refractive index difference between the first and second semiconductor layers 104 and 106 becomes small with the result that the reflectance is reduced. Accordingly, it is desirable that the Al composition value should be ranged from 0.4 to 0.6. The Al composition value of the first semiconductor layer 104 is set to 0.5 in embodiment 1. AlGaN used as the second composition-graded AlGaN layer 103 has an Al composition value that monotonically increases gradually from GaN to $Al_{0.5}Ga_{0.5}N$. Further, the AlGaN used as the first composition-graded AlGaN layer 105 has an Al composition value that monotonically decreases gradually from $Al_{0.5}Ga_{0.5}N$ to GaN. A center reflection wavelength of the multilayer film reflector is set to 400 nm, based on which a film thickness of the second composition-graded AlGaN layer 103 is set to 10 nm, a film thickness of the $Al_{0.5}Ga_{0.5}N$ layer 104 is set to 34 nm, a film thickness of the first composition-graded AlGaN layer 105 is set to 10 nm and a film thickness of the GaN layer 106 is set to 30 nm.

The nitride semiconductor multilayer film reflector with a structure as shown in FIG. 1 is fabricated by a metalorganic chemical vapor deposition (MOCVD) in the following procedure. Firstly, a self-supported GaN substrate 101 whose surface is a group III element face is set in a reacting furnace of a MOCVD machine. Subsequently, a thermal cleaning treatment is carried out for the surface of the self-supported GaN substrate 101 by increasing a temperature of the surface while hydrogen is caused to flow into the reacting furnace. Next, the temperature of the substrate is increased to 1050° C., and an n-type GaN base layer 102 is grown by 300 nm on the self-supported GaN substrate 101 by supplying into the reacting furnace hydrogen serving as a carrier gas, trimethylgallium (TMGa) and ammonia both serving as materials and silane ($SiH_4$) serving as an n-type impurity material gas. The n-type GaN base layer 102 is doped with Si serving as an n-type impurity at a concentration of $2\times10^{18}$ cm$^{-3}$.

Next, the second composition-graded AlGaN layer 103 is grown for the transition from the n-type GaN base layer 102 to the deposition of Al$_{0.5}$Ga$_{0.5}$N layer 104 with an Al composition value of 0.5. The substrate temperature is set to 1050° C. in a similar manner to that in the deposition of n-type GaN base layer 102. The second composition-graded AlGaN layer 103 is grown by 10 nm on the n-type GaN base layer 102 by supplying into the reacting furnace hydrogen serving as a carrier gas, TMGa, trimethylaluminum (TMAl) and ammonia all serving as materials and SiH$_4$ serving as the n-type impurity material gas. In the deposition process of the second composition-graded AlGaN layer 103, a supply amount of TMAl gas serving as an Al material is monotonically increased from 0 to a supply amount to grow the Al$_{0.5}$Ga$_{0.5}$N layer 104. In a similar manner, a supply amount of TMGa gas serving as a Ga material is monotonically changed from a supply amount to grow the GaN layer 106 to a supply amount to grow the Al$_{0.5}$Ga$_{0.5}$N layer 104. Thus, the second composition-graded AlGaN layer 103 is formed on the n-type GaN base layer 102. In the second composition-graded AlGaN layer 103, an Al composition value is monotonically increased from 0 to 0.5 relative to a thickness direction. The second composition-graded AlGaN layer 103 is doped with the n-type impurity Si at the concentration of $2\times10^{18}$ cm$^{-3}$. Although standardized as $2\times10^{18}$ cm$^{-3}$ in the hitherto described layers, a doping concentration of Si may be changed within a region not exceeding $1\times10^{19}$ cm$^{-3}$ as necessary. More specifically, doping may be carried out at a higher concentration when a more low-resistive multilayer film reflector is required. When a higher reflectance is required, doping may be carried out at a lower concentration.

Next, the Al$_{0.5}$Ga$_{0.5}$N layer 104 with an Al composition value of 0.5 is grown by 34 nm on the second composition-graded AlGaN layer 103. The substrate temperature, the carrier gas, the material gas and the impurity material gas are all identical with those in the deposition of the second composition-graded AlGaN layer 103 and a detailed description of these will be eliminated. Amounts of supply of TMGa gas and TMAl gas are fixed to amounts by which the Al$_{0.5}$Ga$_{0.5}$N layer 104 is formable. The Al$_{0.5}$Ga$_{0.5}$N layer 104 is doped with Si serving as the n-type impurity at a concentration of $2\times10^{18}$ cm$^{-3}$.

Next, the first composition-graded AlGaN layer 105 is grown by 10 nm for the transition from the Al$_{0.5}$Ga$_{0.5}$N layer 104 to the GaN layer 106. The substrate temperature, the carrier gas to be caused to flow into the reacting furnace, the material gas and the impurity material gas are all identical with those in the deposition of the second composition-graded AlGaN layer 103 and a detailed description of these will be eliminated. In the deposition process of the first composition-graded AlGaN layer 105, an amount of supply of TMAl gas serving as an Al material is monotonically decreased from a supply amount to grow the Al$_{0.5}$Ga$_{0.5}$N layer 104 to 0. In a similar manner, an amount of supply of TMGa gas serving as the Ga material is monotonically changed from a supply amount to grow the Al$_{0.5}$Ga$_{0.5}$N layer 104 to a supply amount to grow the GaN layer 106. Thus, the first composition-graded AlGaN layer 105 is formed on the Al$_{0.5}$Ga$_{0.5}$N layer 104 and has an Al composition value which is monotonically decreased from 0.5 to 0. Further, a supply amount of SiH$_4$ serving as the impurity material gas is increased since the first composition-graded AlGaN layer 105 corresponds to the group III element face side of the Al$_{0.5}$Ga$_{0.5}$N layer 104. The first composition-graded AlGaN layer 105 is doped with Si as the n-type impurity at a high concentration of $5\times10^{19}$ cm$^{-3}$.

Next, the GaN layer 106 is grown by 30 nm on the first composition-graded AlGaN layer 105. The substrate temperature, the carrier gas to be caused to flow into the reacting furnace, the material gas and the impurity material gas are all identical with those in the deposition of the n-type GaN base layer 102 and a detailed description of these will be eliminated. The GaN layer 106 is doped with Si as the n-type impurity at a concentration of $2\times10^{18}$ cm$^{-3}$.

Thus, when one pair of stacked films include the second composition-graded AlGaN layer 103/the Al$_{0.5}$Ga$_{0.5}$N layer 104 and the first composition-graded AlGaN layer 105/the GaN layer 106, 49 pairs are stacked in total and thereafter, the second composition-graded AlGaN layer 103 and the Al$_{0.5}$Ga$_{0.5}$N layer 104 are again stacked, so that a nitride semiconductor multilayer film reflector having 49.5 pairs of the stacked layers is fabricated.

Figure 2:
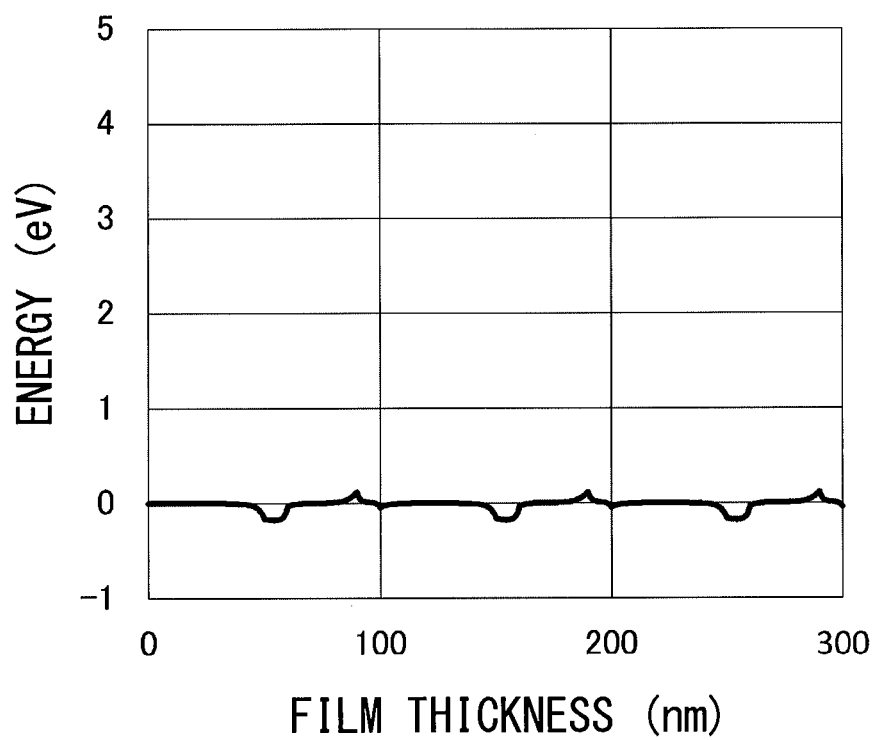
FIG. 2 is a graph showing energy levels of electrons at bottoms of conduction bands in the nitride semiconductor multilayer film reflector with three pairs of layers in embodiment 1.

Energy levels of electrons at bottoms of conduction bands of the fabricated reflector are obtained by calculation. FIG. 2 shows energy levels of electrons at bottoms of conduction bands of the fabricated reflector having three pairs of the stacked layers. An energy level of electrons at a bottom of a GaN conduction band is standardized as 0 eV. As understood from FIG. 2, the stacked films of the second composition-graded AlGaN layer 103/the Al$_{0.5}$Ga$_{0.5}$N layer 104 and the first composition-graded AlGaN layer 105/the GaN layer 106 have the bottoms of conduction bands which have almost no band offsets and are substantially flat, so that it can be understood that electrons as carriers are movable without influences of energy barrier. More specifically, resistance reduction can be realized in the nitride semiconductor multilayer film reflector.

Figure 3:
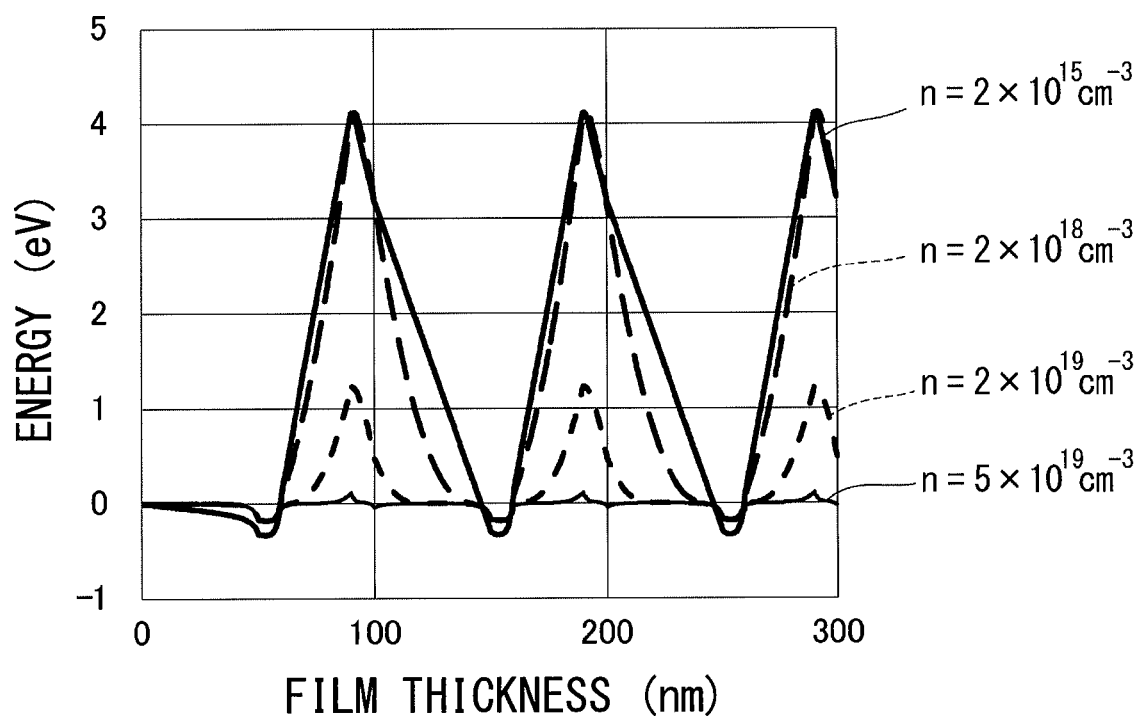
FIG. 3 is a graph showing Si doping concentration dependency of the energy level as shown in FIG. 2 upon the first composition-graded AlGaN layer.

FIG. 3 shows energy levels of electrons at bottoms of conduction bands of the nitride semiconductor multilayer film reflector having three pairs of the stacked films in the case where the doping concentration of Si is changed from $2\times10^{15}$ cm$^{-3}$ to $2\times10^{18}$ cm$^{-3}$, $2\times10^{19}$ cm$^{-3}$ and $5\times10^{19}$ cm$^{-3}$, as comparative examples. FIG. 3 suggests that a high energy barrier caused by negative fixed charge due to polarization exists in an interface (the first composition-graded AlGaN layer 105) between the Al$_{0.5}$Ga$_{0.5}$N layer 104 and the GaN layer 106, although an energy barrier caused by the difference of bandgap energy between the Al$_{0.5}$Ga$_{0.5}$N layer 104 and the GaN layer 106 becomes gentle by the first and second composition-graded AlGaN layer 105 and 103. Further, it is understood that the height of the energy barrier has an extremely high value of about 4 eV in the case where the doping concentration of Si with which the first composition-graded AlGaN layer 105 is doped is not more than $2\times10^{18}$ cm$^{-3}$.

Figure 4:
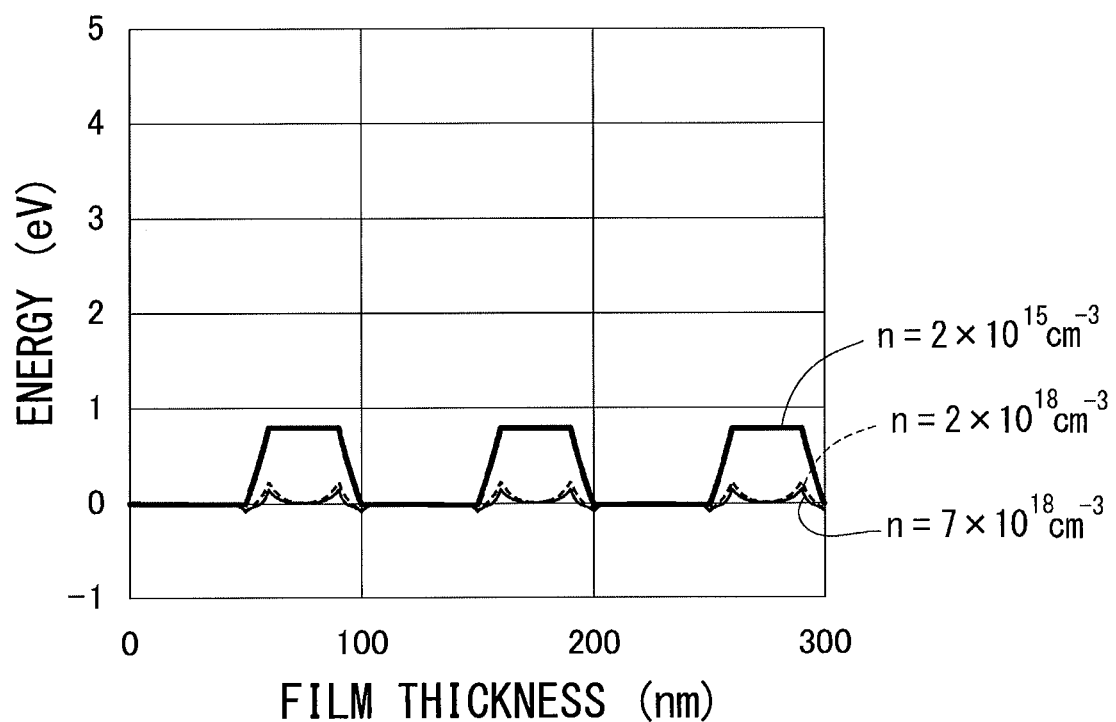
FIG. 4 is a graph showing energy levels of electrons at bottoms of conduction bands in the nitride semiconductor multilayer film reflector with three pairs of layers in the case where polarization effect is not considered, in embodiment 1.

FIG. 4 shows energy levels of electrons at bottoms of conduction bands of the reflector having three pairs of the stacked layers in a case where no polarization is considered. The solid line denotes an energy level in a case where the doping concentration of Si is $2\times10^{15}$ cm$^{-3}$. Two dotted lines denote energy levels in the case where the doping concentration of Si is $2\times10^{18}$ cm$^{-3}$ and $7\times10^{18}$ cm$^{-3}$, respectively. As understood from FIG. 4, even when effect of polarization is not taken into consideration, an energy barrier of about 0.8 eV is formed since the bandgap energy is larger in the Al$_{0.5}$Ga$_{0.5}$N layer than in the GaN layer. However, when the Al$_{0.5}$Ga$_{0.5}$N layer is doped with Si at the concentration of about $10^{18}$ cm$^{-3}$, the energy barrier is sufficiently lowered, with the result that the energy levels become almost flat. No reason for high resistance of the nitride multilayer film reflector can be explained regarding a model in which polarization is not considered.

When the foregoing is summed up, the high energy barrier associated with polarization effects can be considered as a major cause of not being able to render the nitride semiconductor multilayer film reflector low-resistive. On the other hand, as shown in FIG. 3, the energy barrier due to polarization effects is reduced when the doping concentration of Si is further increased. It is understood that almost all the energy barrier disappears when the doping concentration of Si is $5 \times 10^{19}$ cm$^{-3}$ with the result that the energy levels become flat.

Figure 5:
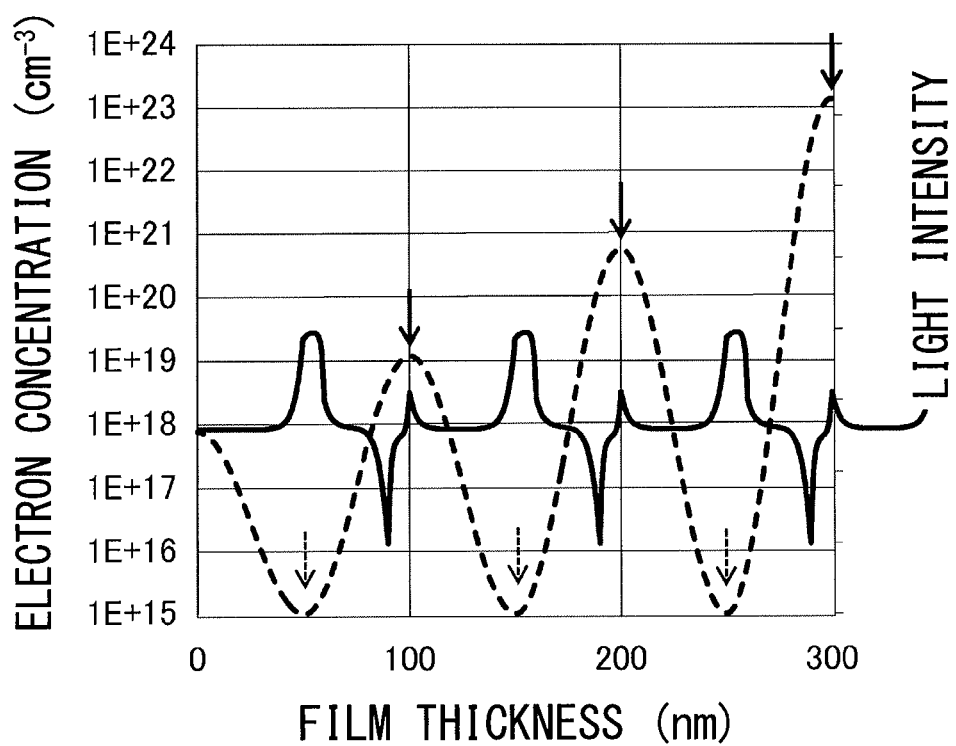
FIG. 5 is a graph showing the relationship between standing light wave intensity distribution and electron concentration distribution in the case where light is incident on the nitride multilayer film reflector with the three pairs of layers, in embodiment 1.

The following will describe light absorption in a case where light is incident on the nitride semiconductor multilayer film reflector. An amount of light absorption within the multilayer film reflector depends upon a standing light wave intensity distribution and an absorption factor in the multilayer film, namely, an electron concentration distribution. FIG. 5 is a graph showing the relationship between the standing light wave intensity distribution and the electron concentration distribution in the nitride semiconductor multilayer film reflector having three pairs of stacked films. In the graph, the solid line denotes a thicknesswise profile of the electron concentration, and a dotted line denotes a thicknesswise profile of the standing light wave intensity distribution. Further, a solid line arrow denotes an interface (the first composition-graded AlGaN layer 105) at the group III element face side of the $Al_{0.5}Ga_{0.5}N$ layer 104, and a dotted line arrow denotes an interface (the second composition-graded AlGaN layer 103) at the N (nitrogen) face side. When a nitride semiconductor face light-emitting laser is fabricated, a resonator structure is configured at the group III element face side of the nitride semiconductor multilayer film reflector (see FIG. 6). As a result, an antinode of the standing light wave is formed on the interface at the group III element face side of the $Al_{0.5}Ga_{0.5}N$ layer 104, as shown by the solid line arrow and a node of the standing light wave is formed on the interface at the N face side as shown by the dotted line arrow in FIG. 5.

There is a close correlation between the electron concentration value and the energy levels of electrons at bottoms of conduction bands. The electron concentration is increased on the interface at the N face side of the $Al_{0.5}Ga_{0.5}N$ layer 104 where the energy level of electrons at the bottom of the conduction band is lower than 0 eV. Further, the electron concentration is reduced on the interface at the group III element face side of the $Al_{0.5}Ga_{0.5}N$ layer 104 where the energy level of electrons at the bottom of the conduction band is higher than 0 eV.

The interface (the first composition-graded AlGaN layer 105) at the group III element face side of the $Al_{0.5}Ga_{0.5}N$ layer 104 is doped with Si at an exceedingly high concentration of $5 \times 10^{19}$ cm$^{-3}$, as described above, However, since the negative fixed charge due to the polarization acts so as to repel electrons by Coulomb's force, the electron concentration remains at a low value of $3 \times 10^{18}$ cm$^{-3}$ as shown by solid line arrow in FIG. 5. As a result, the absorption factor is expected to be a low value of not more than 10 cm$^{-1}$. Accordingly, free carrier absorption is not almost caused even when the interface at the group III element face side of the $Al_{0.5}Ga_{0.5}N$ layer 104 doped with high concentration of Si corresponds to the antinode of the standing light wave as shown in FIG. 5.

A technique is conventionally known of doping a high concentration impurity into a film for the purpose of resistance reduction of the semiconductor multilayer film reflector. However, upon execution of the high-concentration impurity doping, the number of free carriers is increased in an interface of the multilayer film, with the result that there arises a problem of reduction in the reflectance by light absorption loss with the free carrier increase. However, as described above, even when the interface (the first composition-graded AlGaN layer 105) at the group III element face side of the $Al_{0.5}Ga_{0.5}N$ layer 104 is doped with the high concentration n-type impurity (Si), the absorption loss is not rendered large since a polarization fixed charge repels electrons. As a result, the nitride semiconductor multilayer film reflector can be rendered low-resistive while reduction in the reflectance is suppressed.

On the other hand, the interface at the N face side of the $Al_{0.5}Ga_{0.5}N$ layer 104 is doped with Si at the concentration of $2 \times 10^{18}$ cm$^{-3}$. However, since a fixed positive charge resulting from the polarization attracts electrons, the electron concentration takes a high value of about $3 \times 10^{19}$ cm$^{-3}$ as shown by the dotted line arrow in FIG. 5. Accordingly, an absorption factor is expected to also take a large value of 100 cm$^{-1}$. However, the interface at the N face side of the $Al_{0.5}Ga_{0.5}N$ layer 104 corresponds to the node of the standing light wave as shown by the dotted line arrow in FIG. 5, so that light absorption is not almost caused. Hence, there is no concern about reduction in the reflectance.

In order that the laser may be operated, light loss due to absorption in the multilayer film reflector needs to be reduced to at least 20 cm$^{-1}$ or less, more preferably, 10 cm$^{-1}$ or less. The nitride multilayer film reflector of embodiment 1 meets the required specifications.

Figure 6:
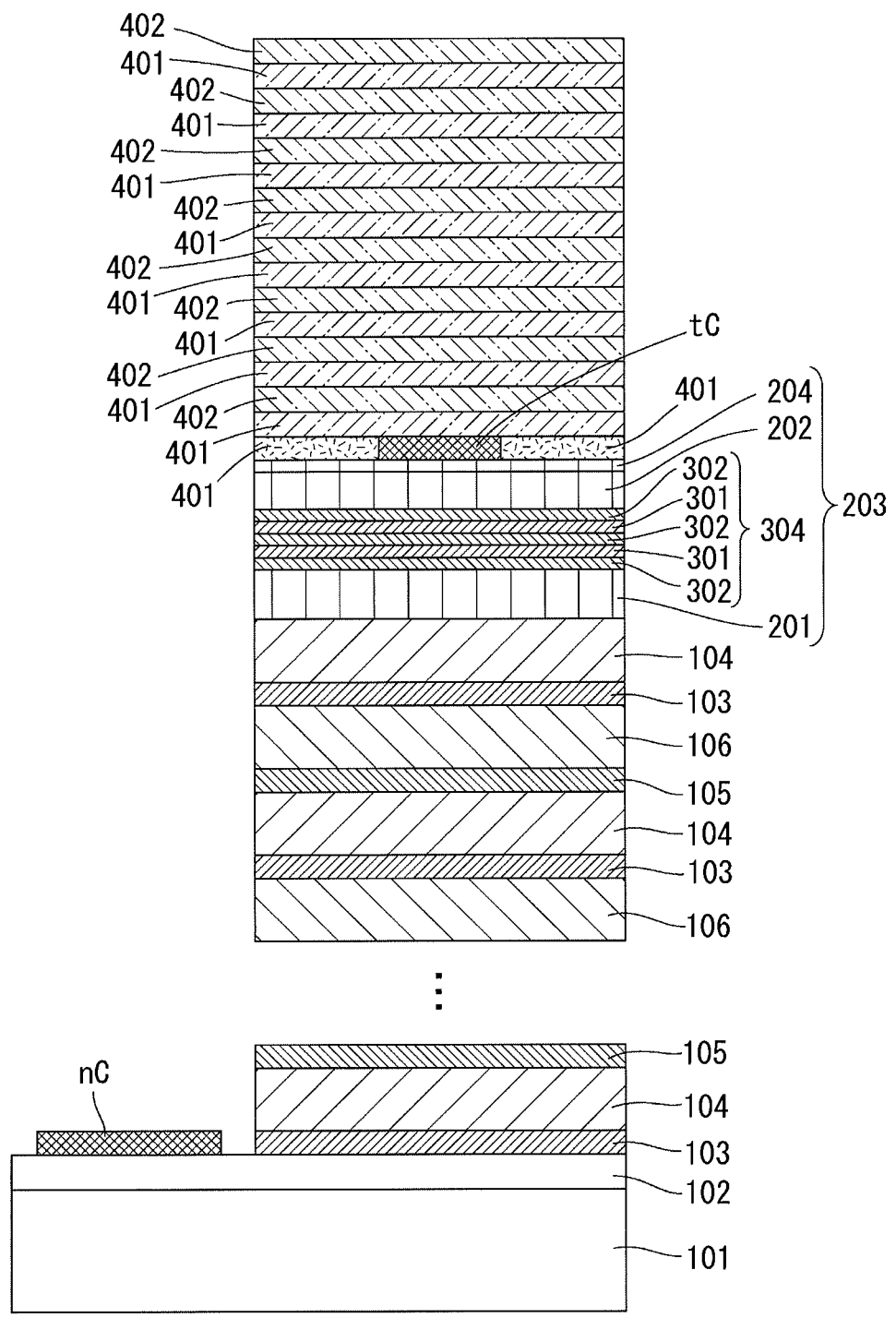
FIG. 6 is a sectional side view of a nitride semiconductor surface emitting laser of embodiment 1.

The following will describe a procedure of forming a single wavelength resonator 203 structure including a GaInN triple quantum well active layer 304 on 49.5 pairs of the second composition-graded AlGaN layer 103/the $Al_{0.5}Ga_{0.5}N$ layer 104 and the first composition-graded AlGaN layer 105/the GaN layer 106, thereby fabricating a nitride semiconductor surface emitting laser, as shown in FIG. 6.

Firstly, an n-type GaN layer 201 is grown by 70 nm on the multilayer film reflector (the $Al_{0.5}Ga_{0.5}N$ layer 104) in order that the single wavelength resonator 203 structure may be fabricated. The n-type GaN layer 201 is doped with Si as the n-type impurity at a concentration of $2 \times 10^{18}$ cm$^{-3}$. Subsequently, 2.5 pairs of a GaInN quantum well layer 302 of 3 nm and a GaN barrier layer 301 of 6 nm are formed on the n-type GaN layer 201 in turn, so that a GaInN triple quantum well active layer 304 is grown. Subsequently, a p-type GaN layer 202 of 60 nm is grown on the GaInN triple quantum well active layer 304 (the GaN barrier layer 304). Cyclopentadienyl magnesium (CP$_2$Mg) is used as a p-type impurity gas material. The p-type GaN layer 202 is doped with Mg as the p-type impurity at a concentration of $2 \times 10^{19}$ cm$^{-3}$. Lastly, a p-type GaN contact layer 204 is grown by 10 nm on the p-type GaN layer 202. The p-type GaN contact layer 204 is doped with Mg as the p-type impurity at a concentration of $2 \times 10^{20}$ cm$^{-3}$. Thus, the single wavelength resonator 203 with a total film thickness of 160 nm is formed on the multilayer film reflector (the $Al_{0.5}Ga_{0.5}N$ layer 104) as shown in FIG. 6.

Next, a p-side electrode and an n-side electrode nC for current injection are formed. Firstly, an SiO$_2$ film 401 is deposited by 20 nm on the single wavelength resonator 203 (the p-type GaN contact layer 204). An opening having a diameter of 10 um is formed in a central part of the SiO$_2$ film 401 by photolithography and dry etching so that the p-type GaN contact layer 204 is exposed. Subsequently, an ITO transparent electrode tC is grown by 20 nm on the p-type GaN contact layer 204 exposed in the opening bottom. The ITO transparent electrode tC serves as a p-side contact electrode and also as a current constrictor. A Ti/Au electrode (not shown) is formed which has a peripheral part brought into contact with a peripheral part of the ITO transparent electrode tC and a pad part for wire bonding, so that a p-side electrode is formed. On the other hand, photolithography is carried out to partially dry-etch the multilayer film reflector and the single wavelength resonator 203 thereby to expose the n-type GaN base layer 102. A Ti/Al/Ti/Au electrode is deposited on the surface of the n-type GaN base layer 102 to be formed into the n-side electrode nC as shown in FIG. 6. The forming of the p-side electrode and the n-side electrode nC realizes current injection into the multilayer film reflector and the single wavelength resonator 203.

Lastly, when 8 pairs of dielectric multilayer films of an $SiO_2$ layer 401 and a $ZrO_2$ layer 402 having a reflection center wavelength of 400 nm are stacked on the ITO transparent electrode tC, the nitride semiconductor surface emitting laser is completed which has the single wavelength resonator 203 between a pair of multilayer film reflectors, as shown in FIG. 6.

According to the foregoing embodiment, between the $Al_{0.5}Ga_{0.5}N$ layer 104 serving as the first semiconductor layer and the GaN layer 106 serving as the second semiconductor layer, there are provided the first composition-graded AlGaN layer 105 and the second composition-graded AlGaN layer 103 having the respective Al composition value which is adjusted to become lower as coming close to the GaN layer 106 from the $Al_{0.5}Ga_{0.5}N$ layer 104. These layers are further stacked into a plurality of layers, so that the nitride multilayer film reflector is fabricated. As a result, since the energy levels of electrons at bottoms of conduction bands of the respective layers are almost without band offset, taking a continuous shape, a barrier against electrons serving as carriers is reduced. Further, the first composition-graded AlGaN layer 105 is doped with Si at the concentration of not less than $5 \times 10^{19}$ $cm^{-3}$. This can reduce the energy barrier produced by the polarization effects between the $Al_{0.5}Ga_{0.5}N$ layer 104 and the GaN layer 106 to a large degree. Accordingly, the nitride semiconductor multilayer film reflector can achieve resistance reduction, so that current injection becomes possible.

Further, since each of the first composition-graded AlGaN layer 105 and the second composition-graded AlGaN layer 103 has a film thickness of 10 nm and is accordingly thin, the reflectance can be prevented from reduction in the nitride semiconductor multilayer film reflector.

Further, the Al composition value of the first semiconductor layer 104 is set to 0.5, with the result that a favorable crystallinity and high reflectance can be compatible with each other. Further, since AlGaN and GaN can grow relatively rapidly in nitride semiconductors, the number of manufacturing processes and manufacturing costs of the nitride semiconductor multilayer film reflector can be reduced to a large degree.

Further, the nitride semiconductor surface emitting laser provided with the above-described nitride semiconductor multilayer film reflector can perform laser oscillation by current injection. As a result, a conventional intracavity structure in which current injection is carried out from the side of the resonator need not be formed, so that the length of the resonator can be equalized with that of the single wavelength resonator 203. With this, since the length of the resonator is reduced, an internal loss, a threshold current necessary for the laser oscillation can be reduced to a large degree and differential quantum efficiency can also be improved.

Embodiment 2

Figure 7:
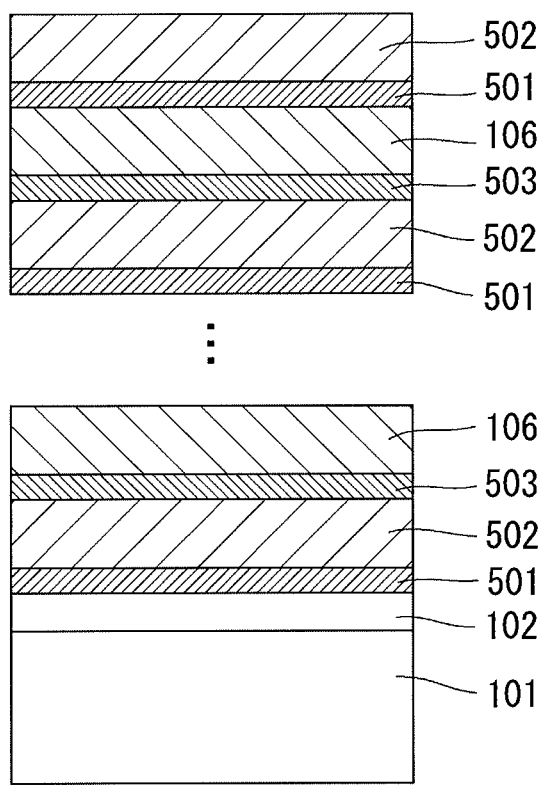
FIG. 7 is a sectional view of the nitride semiconductor multilayer film reflector of embodiment 2.

The nitride semiconductor multilayer film reflector is fabricated which includes pairs of stacked structures each one of which pairs includes a second composition-graded AlInN layer (the second composition-graded layer) 501/an Al0.85In0.15N layer (the first semiconductor layer) 502 and a first composition-graded AlInN layer (the first composition-graded layer) 503 and the GaN layer (the second semiconductor layer) 106, as shown in FIG. 7. Embodiment 2 differs from embodiment 1 in the use of AlInN, instead of AlGaN, in the first semiconductor layer 502, the first composition-graded AlInN layer 503 and the second composition-graded AlInN layer 501. Al0.85In0.15N is selected as the first semiconductor layer 502. GaN is also selected as the second semiconductor layer 106 in the same manner as in embodiment 1. The Al composition value of the first semiconductor layer 502 may be 0.83 in order that the first semiconductor layer 502 may be lattice-matched with the GaN. However, compressive strain is inherent in the first composition-grade AlInN layer 503 and the second composition-graded AlInN layer 501. Accordingly, the Al composition value of the first semiconductor layer 502 is set to 0.85 so that tensile strain is inherent in the first semiconductor layer 502, whereby cumulative strain in an overall multilayer film is reduced as much as possible. AlInN used as the second composition-graded AlInN layer 501 has an Al composition which gradually increases monotonically from an Al composition value of 0.6 substantially corresponding to the energy level of electrons at the bottom of the GaN conduction band to an Al composition value of 0.85 of the first semiconductor layer 502. Further, AlInN used as the first composition-graded AlInN layer 503 has an Al composition which gradually decreased monotonically from 0.85 to 0.6. This can smooth the changes in the energy levels of electrons at bottoms of conduction bands of the first semiconductor layer 502, the second semiconductor layer 106, the first composition-graded AlInN layer 503 and the second composition-graded AlInN layer 501, with the result that the energy barrier against electrons can be reduced. Further, a center reflection wavelength of the multilayer film reflector is set to 400 nm, based on which a film thickness of the second composition-graded. AlInN layer 501 is set to 10 nm, a film thickness of the Al0.85In0.15N layer 502 is set to 32 nm, a film thickness of the first composition-graded AlInN layer 503 is set to 10 nm and a film thickness of the GaN layer 106 is set to 30 mm.

The nitride semiconductor multilayer film reflector having the structure as shown in FIG. 7 is fabricated by a metalorganic chemical vapor deposition (MOCVD) in the following procedure. Since the fabricating procedure from start to the n-type GaN base layer 102 is similar to that in embodiment 1, the detailed description of this part of the fabricating procedure will be eliminated.

The second composition-graded AlInN layer 501 is grown on the n-type GaN base layer 102. The substrate temperature is set to 750° C. Nitrogen serving as a carrier gas, TMAl and trimethylindium (TMIn) and ammonia all serving as materials and SiH4 serving as an n-type impurity material gas are caused to flow into the reactive furnace, so that the second composition-graded AlInN layer 501 is grown by 10 nm on the n-type GaN base layer 102. In the deposition process of the second composition-graded AlInN layer 501, a supply amount of TMAl gas serving as the Al material is monotonically increased from a supply amount growing $Al_{0.6}In_{0.3}N$ having the Al composition value of 0.6 to a supply amount growing $Al_{0.85}In_{0.15}N$ layer 502 having the Al composition value of 0.85. In a similar manner, a supply amount of the TMIn gas serving as an In material is monotonically changed from a supply amount growing an $Al_{0.6}In_{0.3}N$ having an In composition value of 0.3 to a supply amount growing an $Al_{0.85}In_{0.15}N$ layer 502 having an In composition value of 0.15. Thus, the second composition-graded AlInN layer 501 is formed on the n-type GaN base layer 102 and has the Al composition value monotonically increased from 0.6 to 0.85. The second composition-graded AlInN layer 501 is doped with Si as the n-type impurity at the concentration of $2\times10^{18}$ $cm^{-3}$.

Next, the $Al_{0.85}In_{0.15}N$ layer 502 having the Al composition value of 0.85 is grown by 32 nm on the second composition-graded AlInN layer 501. In this case, the substrate temperature and the carrier gas, the material gases and the impurity material gas all caused to flow into the reactive furnace are similar to those in the deposition of the second composition-graded AlInN layer 501. Accordingly, the detailed description of these gases will be eliminated. The supply amounts of TMAl and TMIn gases are fixed to a growth condition of the $Al_{0.85}In_{0.15}N$ layer 502. The $Al_{0.85}In_{0.15}N$ layer 502 is doped with Si as the n-type impurity at the concentration of $2\times10^{18}$ $cm^{-3}$.

Next, the first composition-graded AlInN layer 503 is grown by 10 nm on the $Al_{0.85}In_{0.15}N$ layer 502. In this case, the substrate temperature and the carrier gas, the material gases and the impurity material gas all caused to flow into the reactive furnace are similar to those in the deposition of the second composition-graded AlInN layer 501. Accordingly, the detailed description of these gases will be eliminated. In the deposition process of the first composition-graded AlInN layer 503, a supply amount of TMAl gas as the Al material is monotonically decreased from a supply amount to grow the $Al_{0.85}In_{0.15}N$ layer 502 to a supply amount to grow $Al_{0.6}In_{0.3}N$. In a similar manner, a supply amount of TMIn gas as the In material is monotonically changed from a supply amount to grow the $Al_{0.85}In_{0.15}N$ layer 502 to a supply amount to grow $Al_{0.6}In_{0.3}N$. Thus, the first composition-graded AlInN layer 503 is formed on the $Al_{0.85}In_{0.15}N$ layer 502 and has the Al composition value monotonically decreased from 0.85 to 0.6. Further, since the first composition-graded AlInN layer 503 corresponds to the group III element face side of the $Al_{0.85}In_{0.15}N$ layer 502, a supply amount of $SiH_4$ as the impurity material gas is increased. As a result, the first composition-graded AlInN layer 503 is doped with Si as the n-type impurity at a high concentration of $5\times10^{19}$ $cm^{-3}$.

Next, the GaN layer 106 is grown by 30 nm on the first composition-graded AlInN layer 503. In this case, the substrate temperature and the carrier gas, the material gases and the impurity material gas all caused to flow into the reactive furnace are similar to those in the deposition of the n-type GaN base layer 102. Accordingly, the detailed description of the substrate temperature and these gases will be eliminated. The GaN layer 106 is doped with Si as the n-type impurity at the concentration of $2\times10^{18}$ $cm^{-3}$.

Thus, when one pair of stacked films include the second composition-graded AlInN layer 501/the $Al_{0.85}In_{0.15}N$ layer 502 and the first composition-graded AlInN layer 503/the GaN layer 106, 49 pairs are stacked in total and thereafter, the second composition-graded AlInN layer 501 and the $Al_{0.85}In_{0.15}N$ layer 502 are again stacked, so that a nitride semiconductor multilayer film reflector having 49.5 pairs of the stacked layers as shown in FIG. 7 is fabricated.

Figure 8:
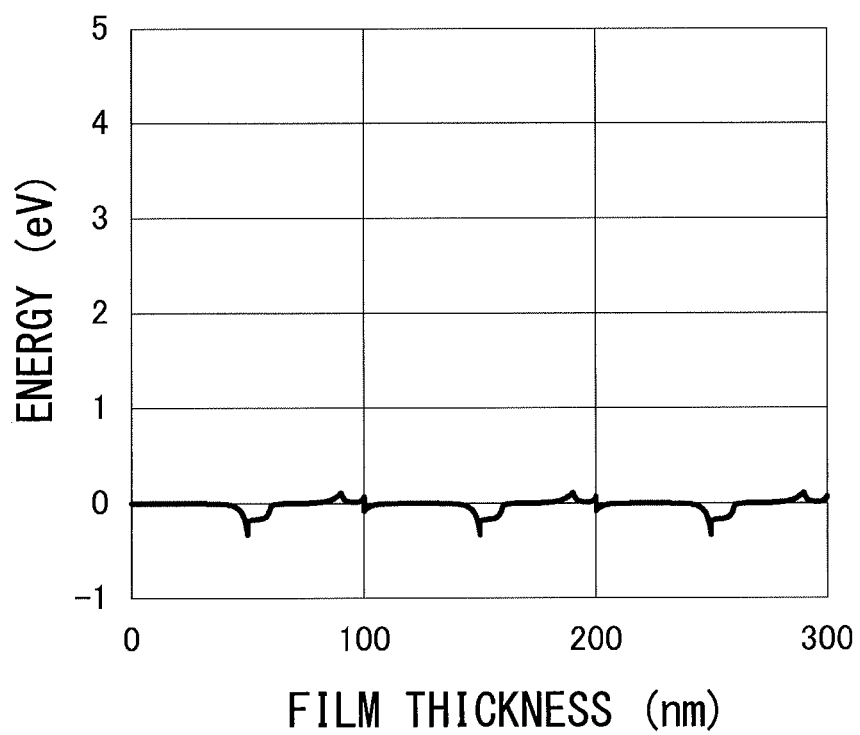
FIG. 8 is a graph showing energy levels of electrons at bottoms of conduction bands in the nitride semiconductor multilayer film reflector with the three pairs of layers in embodiment 2.

Energy levels of electrons at bottoms of conduction bands of the fabricated reflector are obtained by calculation. FIG. 8 shows energy levels of electrons at bottoms of conduction bands of the fabricated reflector having three pairs of the stacked layers. An energy level of electrons at a bottom of a GaN conduction band is standardized as 0 eV. As understood from FIG. 8, the stacked film of the second composition-graded AlInN layer 501/the $Al_{0.85}In_{0.15}N$ layer 502 and the first composition-graded AlInN layer 503/the GaN layer 106 has energy levels of electrons at bottoms of conduction bands, which levels have almost no band offsets and are substantially flat, so that it can be understood that electrons as carriers are movable without influences of energy barrier. More specifically, resistance reduction can be realized in the nitride semiconductor multilayer film reflector as in embodiment 1.

According to embodiment 2, the first semiconductor layer 502 is the $Al_{0.85}In_{0.15}N$ layer 502 having the Al composition value of 0.85, with the result that the $Al_{0.85}In_{0.15}N$ layer 502 is substantially lattice-matched with the GaN layer 106 serving as the second semiconductor layer. Accordingly, crystal defects such as dislocation is less likely to occur during deposition, and the crystallinity and reflectance of the multilayer film can be improved.

Further, compressive strain is inherent in the first composition-grade AlInN layer 503 and the second composition-graded AlInN layer 501. In order to reduce the compressive strain, the Al composition value of the first semiconductor layer 502 is set to 0.85 but not to 0.83 at which the first semiconductor layer 502 is completely lattice-matched with the GaN layer as the second semiconductor layer 106. As a result, tensile strain is caused in the first semiconductor layer 502 thereby to reduce cumulative strain in an overall multilayer film, with the result that the crystallinity of the whole multilayer film can further be improved.

Further, the nitride semiconductor surface emitting laser provided with the nitride semiconductor multilayer film reflector of embodiment 2 can perform laser oscillation by current injection. As a result, embodiment 2 achieves the same advantageous effects as embodiment 1.

Embodiment 3

Figure 9:
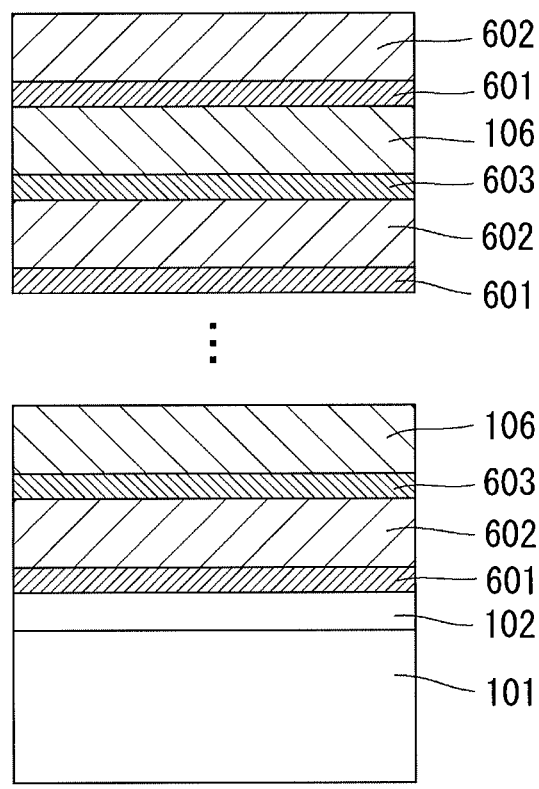
FIG. 9 is a sectional view of the nitride semiconductor multilayer film reflector of embodiment 3.

The nitride semiconductor multilayer film reflector is fabricated which includes 49.5 pairs of stacked structures each one of which pairs includes a second composition-graded AlGaN layer (the second composition-graded layer) 601/an $Al_{0.82}In_{0.18}N$ layer (the first semiconductor layer) 602 and a first composition-graded AlGaN layer (the first composition-graded layer) 603/the GaN layer (the second semiconductor layer) 106, as shown in FIG. 9. Embodiment 3 differs from embodiment 2 in the use of AlGaN, instead of AlInN, in the first composition-graded layer 603 and the second composition-graded layer 601. $Al_{0.82}In_{0.18}N$ is selected as the first semiconductor layer 602. GaN is also selected as the second semiconductor layer 106 in the same manner as in embodiments 1 and 2. The Al composition value of the first semiconductor layer 602 may be set to 0.83 in order to be lattice-matched with the GaN. However, tensile strain is inherent in the first composition-graded AlGaN layer 603 and the second composition-graded AlGaN layer 601. Accordingly, the Al composition value of the first semiconductor layer 602 is set to 0.82 so that compressive strain is inherent in the first semiconductor layer 602, whereby cumulative strain in an overall multilayer film is reduced as much as possible. AlGaN used in the second composition-graded AlGaN layer 601 has an Al composition value which gradually increases monotonically from 0 to 0.5 which value substantially corresponds to the energy level of electrons at the bottom of the conduction band of $Al_{0.82}In_{0.18}N$ as the first semiconductor layer 602. Further, AlGaN used in the first composition-graded AlGaN layer 603 has an Al composition value which gradually decreases monotonically from 0.5 to 0. This can smooth the changes in the energy levels of electrons at bottoms of conduction bands of the first semiconductor layer 602, the second semiconductor layer 106, the first composition-graded layer 603 and the second composition-graded layer 601, with the result that the energy barrier against electrons can be reduced. Further, a center reflection wavelength of the multilayer film reflector is set to 400 nm, based on which a film thickness of the second composition-graded AlGaN layer 601 is set to 10 nm, a film thickness of the $Al_{0.82}In_{0.18}N$ layer 602 is set to 32 nm, a film thickness of the first composition-graded AlGaN layer 603 is set to 10 nm and a film thickness of the GaN layer 106 is set to 30 nm. The procedure of fabricating the nitride semiconductor reflector is similar to those of embodiments 1 and 2 and the detailed description thereof will be eliminated.

Figure 10:
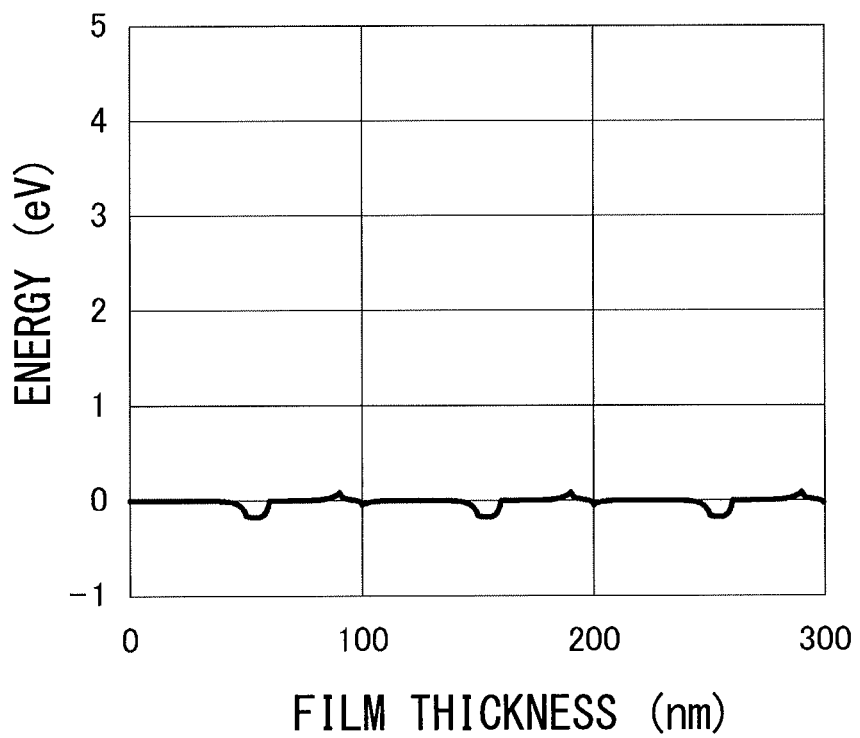
FIG. 10 is a graph showing energy levels of electrons at bottoms of conduction bands in the nitride semiconductor multilayer film reflector with the three pairs in embodiment 3.

Energy levels of electrons at bottoms of conduction bands of the nitride semiconductor multilayer film reflector of embodiment 3 are obtained by calculation. FIG. 10 shows energy levels of electrons at bottoms of conduction bands of the reflector having three pairs of the stacked layers. An energy level of electrons at a bottom of a GaN conduction band is standardized as 0 eV. As understood from FIG. 10, the stacked films of the second composition-graded AlGaN layer 601/the $Al_{0.82}In_{0.18}N$ layer 602 and the first composition-graded AlGaN layer 603/the GaN layer 106 have energy levels of electrons at bottoms of conduction bands which have almost no band offsets and are substantially flat, so that it can be understood that electrons as carriers are movable without influences of energy barrier. More specifically, resistance reduction can be realized in the nitride semiconductor multilayer film reflector in the similar manner as embodiments 1 and 2. Furthermore, the nitride semiconductor surface emitting laser provided with the nitride semiconductor multilayer film reflector of embodiment 3 can perform laser oscillation by current injection. As a result, embodiment 3 achieves the same advantageous effects as embodiments 1 and 2.

According to embodiments 1 to 3, the first and second composition-graded layer 105, 503 or 603 and 103, 501 or 601 is provided between the first semiconductor layer 104, 502 or 602 and the second semiconductor layer 106 having a lower Al composition than the first semiconductor layer 104, 502 or 602. The first and second composition-graded layers 105, 503 or 603 and 103, 501 or 601 are adjusted so that the Al compositions become lower as the first and second composition-graded layers 105, 503 or 603 and 103, 501 or 601 come close to the second semiconductor layer 106 from the first semiconductor layer 104, 502 or 602. As a result, since the energy levels of electrons at bottoms of conduction bands of the respective layers are almost without band offset, taking a continuous shape, a barrier against electrons serving as carriers is reduced. Further, the first composition-graded layer 105, 503 or 603 is doped with the n-type impurity at the concentration of not less than $5 \times 10^{19}$ $cm^{-3}$. This can reduce the energy barrier produced by the polarization effects between the first semiconductor layer 104, 502 or 602 and the second semiconductor layer 106 to a large degree. Accordingly, the nitride semiconductor multilayer film reflector can achieve resistance reduction, so that current injection becomes possible.

Further, when the nitride semiconductor surface emitting laser is provided with the above-described nitride semiconductor multilayer film reflector which is capable of current injection, the length of the resonator can be rendered shorter. Accordingly, since an internal loss and a threshold current can be reduced to a large degree, a high performance nitride semiconductor light-emitting device having high differential quantum efficiency can be provided.

The invention should not be limited to embodiments 1 to 3 as described above with reference to the drawings. For example, the following embodiments are within the technical scope of the invention.

(1) Although the GaN self-supported substrate is used in the foregoing embodiments, a sapphire substrate having high permeability to an oscillation wavelength, zinc oxide (ZnO) substrate or the like may be used, instead.

(2) Although the metal organic chemical vapor deposition (MOCVD) is employed as a technique for growing the nitride semiconductor multilayer film in the foregoing embodiments, a hydride vapor-phase epitaxy (HVPE), a molecular beam epitaxy (MBE), a sputtering method, a laser ablation method or the like may be applied.

(3) Although trimethylgallium (TMGa), trimethylaluminum (TMAl) and trimethylindium (TMIn) are used as materials in the foregoing embodiments, triethylgallium (TEGa), triethylindium (TEIn), triethylaluminum (TEAl) or the like may be used, instead.

(4) Although hydrogen or nitrogen is used as the carrier gas in the foregoing embodiments, another active gas or another inert gas such as argon or a mixture of these gases may be used, instead.

(5) Although Si and Mg are used as n-type and p-type impurities in embodiments 1 to 3 respectively, Ge, Zn, Be or the like may be used, instead.

(6) Although a supply amount of material is changed to control the Al compositions of the first and second composition-graded layers in embodiments 1 to 3, the substrate temperature or the like may be changed, instead.

(7) Although GaN, AlGaN and AlInN are used as the first semiconductor layer, the second semiconductor layer, the first composition-graded layer and the second composition-graded layer in embodiments 1 to 3, AlN or AlGaInN may be used, instead.

(8) Although the number of pairs of the first and second semiconductor layers forming the nitride semiconductor multilayer film reflector is 49.5 in embodiments 1 to 3, the number of pairs is limitless.

(9) Although the single wavelength resonator structure is employed as the light-emitting device in embodiments 1 to 3, two or more wavelength resonator structure may be employed, instead.

(10) Although the n-side electrode is formed on the surface side of the substrate in embodiments 1 to 3, the n-side electrode may be formed on the back side of the substrate when the substrate is electrically conductive.

(11) Although the surface emitting laser is exemplified as the light-emitting device in embodiments 1 to 3, a light-emitting device may be another device having a multilayer film reflector.

EXPLANATION OF REFERENCE SYMBOLS 103 and 601 . . . second composition-graded AlGaN layer (second composition-graded layer)

104 . . . $Al_{0.5}Ga_{0.5}N$ layer (first semiconductor layer)

105, 603 . . . first composition-graded AlGaN layer (first composition-graded layer)

106 . . . GaN layer (second semiconductor layer)

501 second composition-graded AlInN layer (second composition-graded layer)

502 . . . $Al_{0.85}In_{0.15}N$ layer 503 first composition-graded AlInN layer (first composition-graded layer)

602 . . . $Al_{0.82}In_{0.18}N$ layer (first semiconductor layer)

The invention claimed is:

1. A nitride semiconductor multilayer film reflector comprising a first semiconductor layer comprised of a group III nitride semiconductor, a second semiconductor layer, a first composition-graded layer and a second composition-graded layer, the nitride semiconductor multilayer film reflector being fabricated by repeatedly stacking the second composition-graded layer, the first semiconductor layer, the first composition-graded layer and the second semiconductor layer sequentially on a Ga surface,
 wherein the first semiconductor layer has a higher Al composition than the second semiconductor layer;
 wherein the first composition-graded layer is interposed between the first and second semiconductor layers so as to be located at a group III element face side of the first semiconductor layer, the first composition-graded layer being adjusted so that the Al composition thereof becomes lower as the first composition-graded layer comes close to the second semiconductor layer;
 wherein the second composition-graded layer is interposed between the first and second semiconductor layers so as to be located at a nitride face side of the first semiconductor layer, the second composition-graded layer being adjusted so that the Al composition thereof becomes lower as the second composition-graded layer comes close to the second semiconductor layer;
 wherein energy levels of electrons at bottoms of conduction bands of the first and second semiconductor layers and the first and second composition-graded layers are continuous without band offset;
 wherein the first composition-graded layer on which an antinode of a standing light wave having a predetermined wavelength is formed has an n-type impurity concentration of not less than $5 \times 10^{19}$ cm$^{-3}$, another region including the second composition-graded layer on which a node of the standing light wave having the predetermined wavelength is formed has an n-type impurity concentration of not more than $1 \times 10^{19}$ cm$^{-3}$, and a negative fixed charge due to polarization repels electrons in the first composition-grade layer and a positive fixed charge due to polarization attracts electrons in the second composition-graded layer;
 wherein the first and second semiconductor layers are an AlGaN layer and a GaN layer, respectively, and the AlGaN layer has an Al composition value ranging from 0.4 to 0.6; and
 wherein the first and second composition-graded layers are AlGaN layers having Al compositions graded from 0 to the Al composition values respectively.

2. A nitride semiconductor light-emitting device having the nitride semiconductor multilayer film reflector defined in claim 1.

3. The nitride semiconductor multilayer film reflector according to claim 1, wherein the first composition-graded layer and the second composition-graded layer have a common thickness.

4. The nitride semiconductor multilayer film reflector according to claim 3, wherein the second composition-graded layer has less thickness than either of the first and second semiconductor layers.

5. The nitride semiconductor multilayer film reflector according to claim 1, wherein the second composition-graded layer has less thickness than either of the first and second semiconductor layers.

6. A nitride semiconductor multilayer film reflector comprising a first semiconductor layer comprised of a group III nitride semiconductor, a second semiconductor layer, a first composition-graded layer and a second composition-graded layer, the nitride semiconductor multilayer film reflector being fabricated by repeatedly stacking the second composition-graded layer, the first semiconductor layer, the first composition-graded layer and the second semiconductor layer sequentially on a Ga surface,
 wherein the first semiconductor layer has a higher Al composition than the second semiconductor layer;
 wherein the first composition-graded layer is interposed between the first and second semiconductor layers so as to be located at a group III element face side of the first semiconductor layer, the first composition-graded layer being adjusted so that the Al composition thereof becomes lower as the first composition-graded layer comes close to the second semiconductor layer;
 wherein the second composition-graded layer is interposed between the first and second semiconductor layers so as to be located at a nitride face side of the first semiconductor layer, the second composition-graded layer being adjusted so that the Al composition thereof becomes lower as the second composition-graded layer comes close to the second semiconductor layer;
 wherein energy levels of electrons at bottoms of conduction bands of the first and second semiconductor layers and the first and second composition-graded layers are continuous without band offset;
 wherein the first composition-graded layer on which an antinode of a standing light wave having a predetermined wavelength is formed has an n-type impurity concentration of not less than $5 \times 10^{19}$ cm$^{-3}$, another region including the second composition-graded layer on which a node of the standing light wave having the predetermined wavelength is formed has an n-type impurity concentration of not more than $1 \times 10^{19}$ cm$^{-3}$, and a negative fixed charge due to polarization repels electrons in the first composition-grade layer and a positive fixed charge due to polarization attracts electrons in the second composition-graded layer;
 wherein the first and second semiconductor layers are an AlInN layer and a GaN layer respectively and the AlInN layer has an Al composition value ranging from 0.82 to 0.85; and
 wherein the first and second composition-graded layers are AlInN layers having Al compositions graded from 0.6 to the Al composition values respectively.

7. A nitride semiconductor light-emitting device having the nitride semiconductor multilayer film reflector defined in claim 6.

8. The nitride semiconductor multilayer film reflector according to claim 6, wherein the first composition-graded layer and the second composition-graded layer have a common thickness.

9. The nitride semiconductor multilayer film reflector according to claim 8, wherein the second composition-graded layer has less thickness than either of the first and second semiconductor layers.

10. The nitride semiconductor multilayer film reflector according to claim 6, wherein the second composition-graded layer has less thickness than either of the first and second semiconductor layers.

* * * * *